US008178366B2

(12) United States Patent
Miyoshi et al.

(10) Patent No.: US 8,178,366 B2
(45) Date of Patent: May 15, 2012

(54) PATTERN FORMING METHOD, MANUFACTURING METHOD OF SEMICONDUCTOR DEVICE, AND TEMPLATE MANUFACTURING METHOD

(75) Inventors: Seiro Miyoshi, Kanagawa (JP); Hidefumi Mukai, Mie (JP); Takeshi Koshiba, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/015,351

(22) Filed: Jan. 27, 2011

(65) Prior Publication Data

US 2011/0300646 A1    Dec. 8, 2011

(30) Foreign Application Priority Data

Jun. 4, 2010    (JP) ................................. 2010-129292

(51) Int. Cl.
*H01L 21/66* (2006.01)
(52) U.S. Cl. .......... 438/14; 438/694; 438/780; 977/887; 257/E21.529; 264/293
(58) Field of Classification Search .................... 438/14, 438/694, 780; 977/887; 264/293
See application file for complete search history.

(56) References Cited

U.S. PATENT DOCUMENTS

| | | | |
|---|---|---|---|
| 2004/0021254 A1* | 2/2004 | Sreenivasan et al. ......... | 264/406 |
| 2006/0019183 A1* | 1/2006 | Voisin ............................. | 430/22 |
| 2008/0095878 A1* | 4/2008 | Bailey et al. ................... | 425/385 |
| 2010/0050893 A1* | 3/2010 | Simon ............................ | 101/453 |
| 2010/0139862 A1* | 6/2010 | Kolesnychenko et al. ......................... | 156/345.19 |
| 2010/0308485 A1* | 12/2010 | Inanami et al. ............... | 264/40.1 |
| 2011/0171340 A1* | 7/2011 | Resnick et al. ............... | 425/385 |
| 2011/0219635 A1* | 9/2011 | Rangelow ....................... | 33/645 |

FOREIGN PATENT DOCUMENTS

| | | |
|---|---|---|
| EP | 1 072 954 A2 | 1/2001 |
| JP | 2000-194142 | 7/2000 |
| JP | 2001-68411 | 3/2001 |
| JP | 2005-349619 | 12/2005 |
| JP | 2007-165400 | 6/2007 |
| JP | 2008-546186 | 12/2008 |
| JP | 2009-170458 | 7/2009 |
| JP | 2009-274348 | 11/2009 |
| WO | WO 2006/127586 | 11/2006 |

* cited by examiner

*Primary Examiner* — Alexander Ghyka
(74) *Attorney, Agent, or Firm* — Finnegan, Henderson, Farabow, Garrett & Dunner, L.L.P.

(57) ABSTRACT

In the pattern forming method according to the embodiment, second templates are manufactured by an imprint technology using first templates manufactured by applying a predetermined misalignment distribution for each shot on a first substrate by an exposure apparatus. Then, an upper-layer-side pattern is formed by an imprint technology using a second template in which an inter-layer misalignment amount between a lower-layer-side pattern already formed above a second substrate and the upper-layer-side pattern to be formed above the second substrate becomes equal to or lower than a predetermined reference value.

10 Claims, 7 Drawing Sheets

PATTERN FORMING METHOD, MANUFACTURING METHOD OF SEMICONDUCTOR DEVICE, AND TEMPLATE MANUFACTURING METHOD

CROSS-REFERENCE TO RELATED APPLICATIONS

This application is based upon and claims the benefit of priority from the prior Japanese Patent Application No. 2010-129292, filed on Jun. 4, 2010; the entire contents of which are incorporated herein by reference.

FIELD

The present embodiment typically relates to a pattern forming method, a manufacturing method of a semiconductor device, and a template manufacturing method.

BACKGROUND

With the miniaturization of a semiconductor device, miniaturization required for lithography has become severe. As one miniaturizing method of the semiconductor device by using the lithography, there is a process of using nanoimprint lithography. The nanoimprint lithography is a method of transferring a pattern of a template having minute concaves and convexes onto a transfer resist on a wafer in a manner of pressing a mold. In such conventional technology, it is desired to accurately perform alignment between layers in performing pattern formation by using imprint lithography.

DETAILED DESCRIPTION

According to an embodiment, a pattern forming method is provided. In the pattern forming method, a first on-substrate pattern is formed by applying a predetermined misalignment distribution for each shot above a first substrate by an exposure apparatus. Thereafter, first templates are manufactured by cutting off the first on-substrate pattern out of the first substrate for each shot. Then, second templates are manufactured by transferring template patterns of the first templates onto a template substrate by an imprint technology. Then, a template pattern of a second template is transferred onto a second substrate by an imprint technology by using the second template in which an inter-layer misalignment amount that is a misalignment amount between a lower-layer-side pattern already formed above the second substrate and an upper-layer-side pattern to be formed above the second substrate becomes equal to or lower than a predetermined reference value. Consequently, a second on-substrate pattern as the upper-layer-side pattern is formed above the second substrate.

A pattern forming method, a manufacturing method of a semiconductor device, and a template manufacturing method according to the embodiment will be explained below in detail with reference to the accompanying drawings. The present invention is not limited to this embodiment.

(Embodiment)

Figure 1:
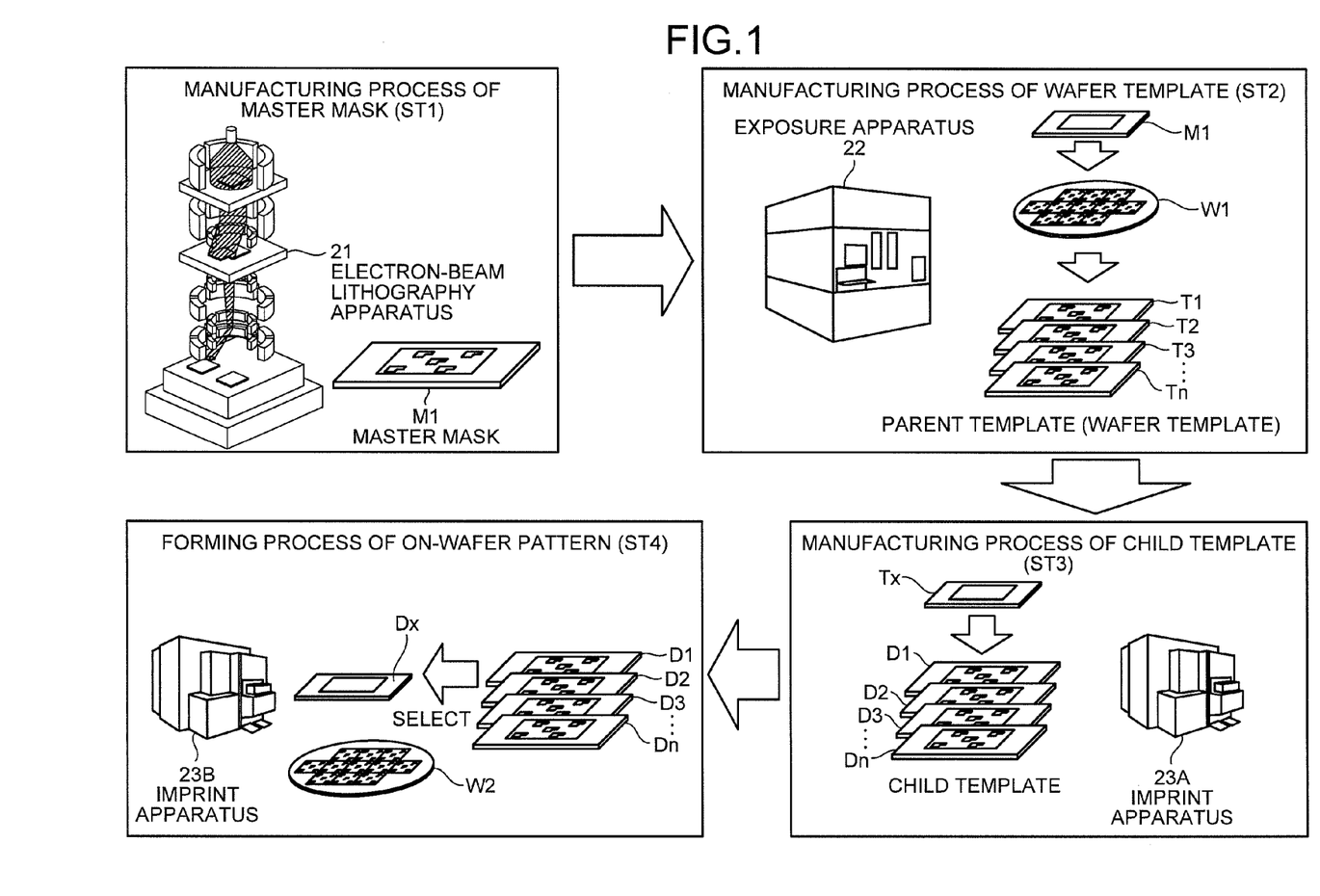
FIG. 1 is a diagram for explaining a pattern forming method according to an embodiment.

FIG. 1 is a diagram for explaining the pattern forming method according to the embodiment. FIG. 1 illustrates a process procedure of the pattern forming method according to the embodiment. In the present embodiment, the case is explained in which a pattern such as a semiconductor integrated circuit pattern is formed above a semiconductor substrate such as a product wafer.

When forming a pattern above a product wafer W2, a manufacturing process of a master mask (ST1), a manufacturing process of a wafer template (ST2), a manufacturing process of a child template (ST3), and a forming process of an on-wafer pattern using the child template (ST4) are performed. In the present embodiment, a pattern to be formed above the product wafer W2 by a nanoimprint lithography (NIL) is aligned accurately with a pattern formed on the lower layer side of the product wafer W2 so that a device to be manufactured satisfies a required performance.

(Manufacturing Process Procedure of Master Mask)

The manufacturing process of the master mask is a process of manufacturing a master mask M1 by using an electron-beam lithography apparatus 21. The master mask M1 is a photomask for exposure used when forming a parent template (wafer template) T1 on a template wafer W1.

Figure 2A:
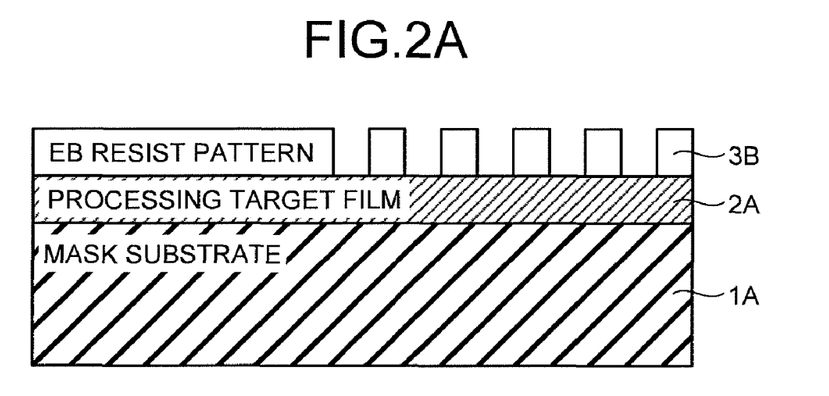
FIG. 2A and FIG. 2B are diagrams illustrating a manufacturing process procedure of a master mask.
Figure 2B:
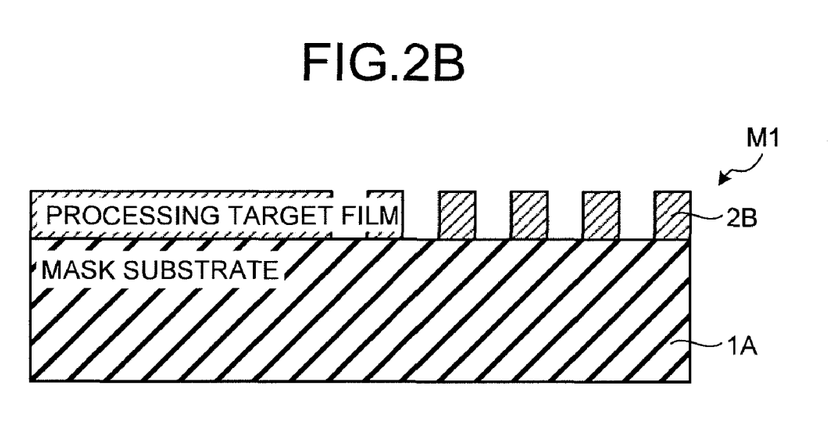

FIG. 2A and FIG. 2B are diagrams illustrating the manufacturing process procedure of the master mask. FIG. 2A and FIG. 2B illustrate cross-sectional views of a mask substrate 1A, the master mask M1, and the like. The manufacturing process of the master mask M1 includes an EB resist patterning process shown in FIG. 2A and a processing-target-film etching process shown in FIG. 2B.

In manufacturing the master mask M1 to be a photomask, as shown in FIG. 2A, the mask substrate 1A that is a blank substrate (quartz substrate) is used. In the manufacturing process of the master mask M1, a processing target film 2A such as a Cr film and a MoSi film is formed above the mask substrate 1A, and EB resist (resist for electron beam lithography) is applied to the processing target film 2A.

Then, the EB lithography is performed on the EB resist by the electron-beam lithography apparatus 21 by using data for mask lithography corresponding to a design pattern of a semiconductor integrated circuit pattern. The EB resist subjected to the EB lithography is baked if needed and becomes an EB resist pattern 3B through a development process.

After the EB resist pattern 3B is formed above the mask substrate 1A, the processing target film 2A above the mask substrate 1A is etched with the EB resist pattern 3B as a mask material. Consequently, a patterned processing target film 2B is formed (FIG. 2B).

Thereafter, a resist residue is ashed, and then the mask substrate 1A is cleaned. Consequently, the patterned master mask M1 is manufactured. For the manufacturing process of the master mask M1, a method other than that shown in FIG. 2A and FIG. 2B can be used.

(Manufacturing Process Procedure of Wafer Template)

Next, the manufacturing process procedure of the wafer template is explained. Resist is applied to the processing target film of the template wafer W1. The template wafer W1 in this example is, for example, a silicon substrate on which parent templates (master templates) T1 to Tn are formed. The parent templates T1 to Tn (n is a natural number) are templates used for manufacturing child templates D1 to Dn. In the following, the child templates D1 to Dn are called a child template Dx in some cases. Moreover, the parent templates T1 to Tn are called a parent template Tx in some cases.

The exposure process is performed on the template wafer W1 to which resist is applied by using the master mask M1 and an exposure apparatus 22. In the present embodiment, shot patterns (parent templates T1 to Tn) to be a candidate of the parent template Tx are formed on the template wafer W1. One to plurality of chips is arranged in each shot pattern.

The pattern with which a pattern formed in an imprint process is aligned is a lower-layer-side pattern 7 to be described later. The lower-layer-side pattern 7 is formed in a predetermined exposure condition, and in the present embodiment, the imprint process is performed with a misalignment distribution corresponding to this exposure condition.

Therefore, the child templates D1 to Dn having various misalignment distributions are manufactured in advance so that the imprint process can be performed with the misalignment distribution corresponding to the exposure condition. Then, the child template Dx corresponding to the misalignment distribution of the lower-layer-side pattern 7 is selected to perform pattern formation on the upper layer side.

In the present embodiment, shots on the template wafer W1 are exposed in various exposure conditions for manufacturing the child templates Dx having various misalignment distributions in advance. Specifically, the exposure process of each shot is performed while changing a pattern arrangement (misalignment distribution) in a shot for each shot. In other words, exposure is performed on the template wafer W1 so that a pattern arrangement (image placement) is different for each shot.

Figure 3:
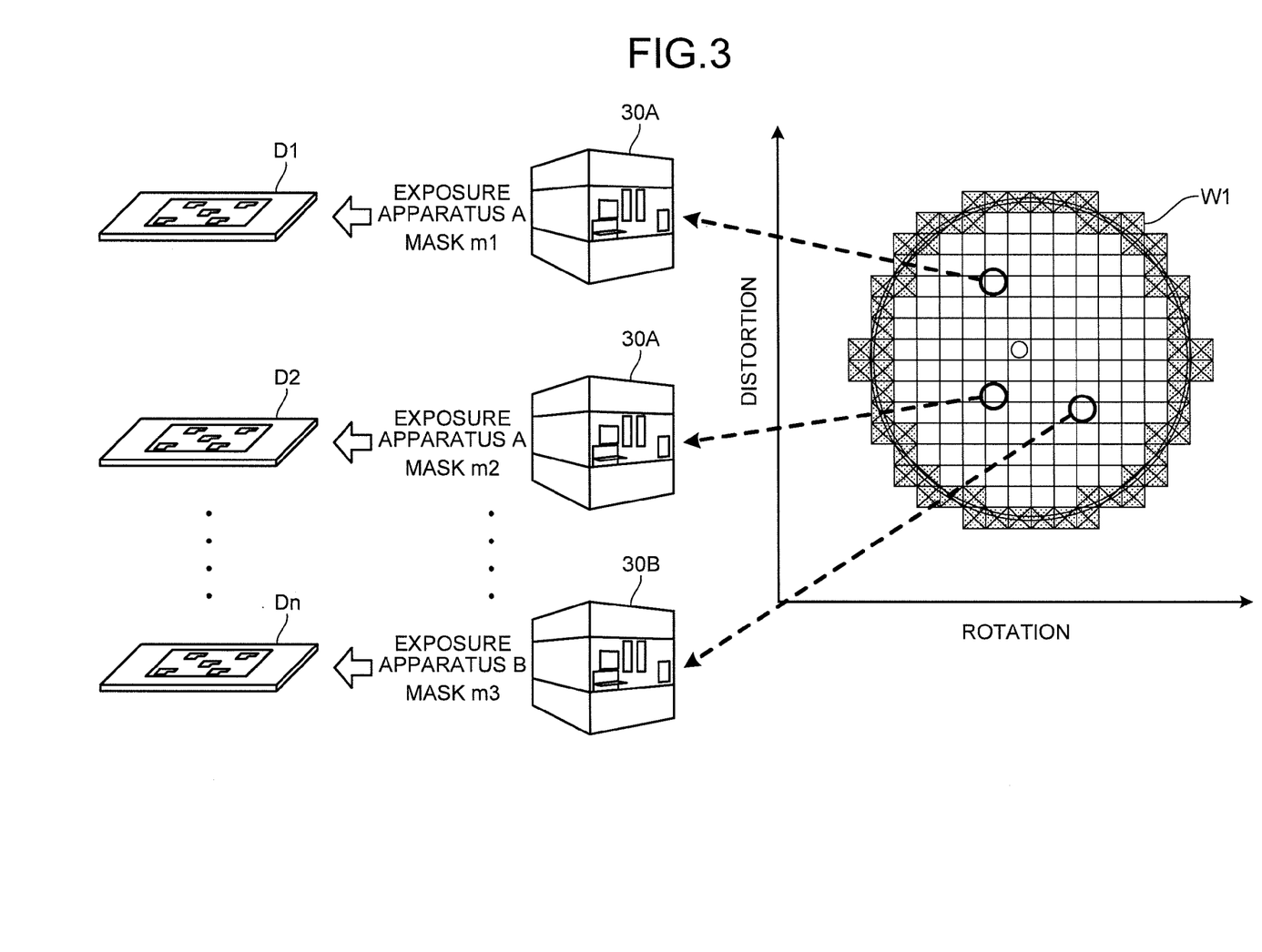
FIG. 3 is a diagram illustrating a misalignment distribution of each shot of a pattern formed on a template wafer.

FIG. 3 is a diagram illustrating the misalignment distribution of each shot of a pattern formed on the template wafer. In this example, the case is explained in which the exposure condition is a combination of an exposure apparatus and a mask. When an exposure apparatus or a mask is different depending on a product or lot, patterns having various misalignment distributions are formed for the combinations of "exposure apparatus+mask".

In the present embodiment, on the upper layer side of the lower-layer-side pattern 7 that is formed with the misalignment distribution corresponding to an exposure apparatus and a mask, a pattern in which the misalignment distribution is accurately corrected is formed by using the NIL process. Therefore, the pattern formation on the template wafer W1 is performed by applying various misalignment distributions for the shots.

Template patterns are formed on the template wafer W1 in advance, for example, by variously changing a misalignment component in a rotation direction of the template pattern and a distortion component of the template pattern for each shot.

FIG. 3 illustrates the case of forming the template patterns by changing a rotation component of misalignment with respect to a shot position (shot coordinates) of the template wafer W1 in a lateral direction and changing the distortion component of misalignment with respect to the shot position of the template wafer W1 in a longitudinal direction.

For example, each shot of the template wafer W1 is exposed in advance to have the misalignment distribution that is approximately the same as the misalignment distribution generated when the lower-layer-side pattern 7 is exposed with the combination of an exposure apparatus and a mask. In other words, the shots of the template wafer W1 are exposed with various misalignment distributions in advance so that the misalignment distributions generated in various combinations of an exposure apparatus and a mask can be corrected.

For example, the rotation component of misalignment and the distortion component of misalignment generated when the lower-layer-side pattern 7 is exposed with the combination of an exposure apparatus 30A and a mask m1 are defined as a first rotation component and a first distortion component, respectively. In this case, for example, a first shot is exposed in advance so that a pattern formed on the template wafer W1 has misalignment including the first rotation component and the first distortion component.

Moreover, the rotation component of misalignment and the distortion component of misalignment generated when the lower-layer-side pattern 7 is exposed with the combination of the exposure apparatus 30A and a mask m2 are defined as the first rotation component and a second distortion component, respectively. In this case, for example, a second shot is exposed in advance so that a pattern formed on the template wafer W1 has misalignment including the first rotation component and the second distortion component.

Furthermore, the rotation component of misalignment and the distortion component of misalignment generated when the lower-layer-side pattern 7 is exposed with the combination of an exposure apparatus 30B and a mask m3 are defined as a second rotation component and a third distortion component, respectively. In this case, for example, an n-th shot is exposed in advance so that a pattern formed on the template wafer W1 has misalignment including the second rotation component and the third distortion component.

Consequently, the child template D1 is formed from the first shot, the child template D2 is formed from the second shot, and the child template Dn is formed from the n-th shot. In this manner, the template wafer W1 is exposed in advance with various misalignment distributions corresponding to various exposure conditions so that a pattern on the upper layer side corresponding to the misalignment distribution of the lower-layer-side pattern 7 can be formed, enabling to select the parent template Tx corresponding to the misalignment distribution of the lower-layer-side pattern 7.

In FIG. 3, the case is explained in which the rotation component of misalignment is changed in the lateral direction of the shot coordinates and the distortion component of misalignment is changed in the longitudinal direction of the shot coordinates; however, a parameter of misalignment to be changed can be arbitrary selected from ones used in the exposure apparatus 22 for alignment correction.

Figure 4:
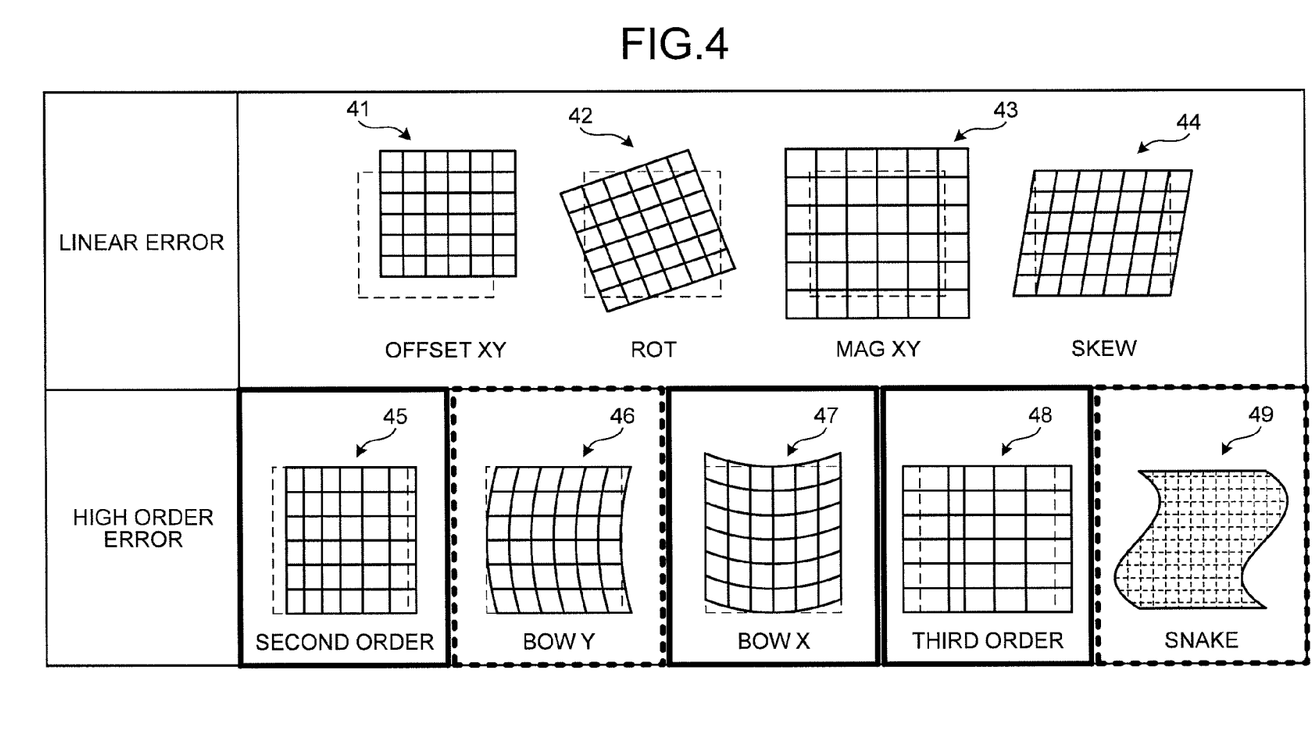
FIG. 4 is a diagram illustrating examples of a misalignment correction performed by an exposure apparatus.

FIG. 4 is a diagram illustrating examples of a misalignment correction performed by the exposure apparatus. FIG. 4 illustrates a misalignment correction method of each shot used when the exposure apparatus 22 exposes the template wafer W1. The misalignment distribution includes a misalignment (Linear error) of a linear component and a misalignment (High order error) of a high-order nonlinear component (high order component).

The misalignment correction of the linear component includes a correction (OffsetXY) 41 of translating the position of the whole shot, a correction (Rot) 42 of rotationally moving the position of the whole shot, a correction (MagXY) 43 of changing a magnification of the whole shot, a correction (Skew) 44 of diagonally skewing the whole shot, and the like.

The misalignment correction of the high order component includes a correction (second Order) 45 of narrowing an exposure region as an X coordinate in a shot becomes small and widening the exposure region as an X coordinate in a shot becomes large. It is applicable to widen the exposure region as an X coordinate in a shot becomes small and narrow the exposure region as an X coordinate in a shot becomes large. Moreover, the correction 45 can be applied to the Y direction.

Moreover, the misalignment correction of the high order component includes a correction (BowY) 46 of bowing the whole shot with respect to the X direction and a correction (BowX) 47 of bowing the whole shot with respect to the Y direction. Furthermore, the misalignment correction of the high order component includes a correction (third order) 48 of narrowing or widening an exposure region at a predetermined ratio for each coordinate in the X direction or the Y direction in a shot. Moreover, the misalignment correction of the high order component includes a correction (Snake) 49 of bending the whole shot into a wave shape. Among the above corrections, the corrections 44 to 49 are corrections for the distortion component.

After each shot of the template wafer W1 is exposed by the exposure apparatus 22, the template wafer W1 is developed, whereby a resist pattern is formed on the processing target film of the template wafer W1. The processing target film is etched from above this resist pattern, so that patterns of the parent templates T1 to Tn are formed on the template wafer W1. In the exposure apparatus 22 in this example, any light source of MUV (middle ultraviolet), KrF, ArF, F2, EUV (Extreme Ultraviolet), and the like can be used.

The patterns formed on the template wafer W1 are cut off from the template wafer W1 for each shot, so that the parent templates T1 to Tn are formed. Thereafter, the parent templates T1 to Tn are imprinted onto imprint resin above a template substrate, so that the child templates (Daughter templates) D1 to Dn are manufactured.

(Manufacturing Process Procedure of Child Template)

Figure 5A:
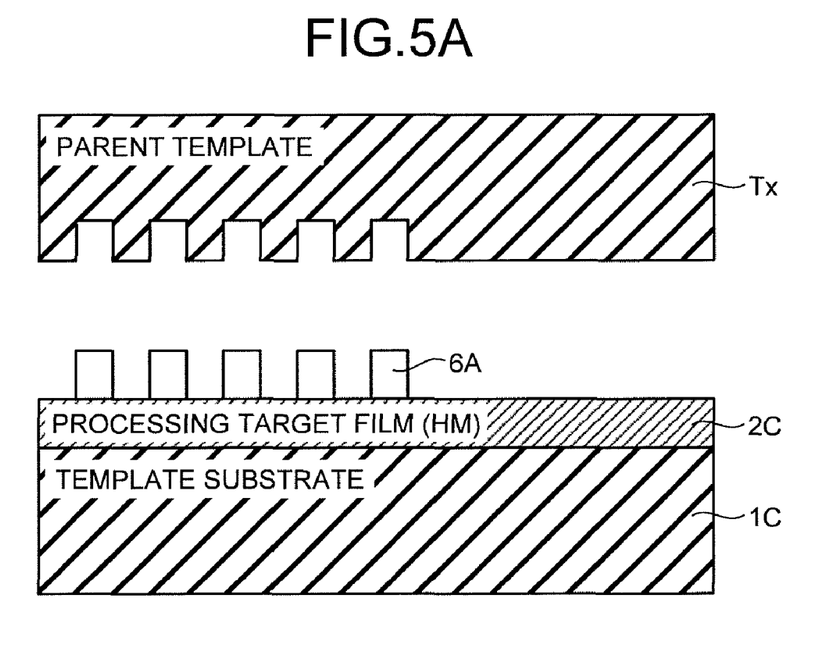
FIG. 5A and FIG. 5B are diagrams illustrating a manufacturing process procedure of a child template.
Figure 5B:
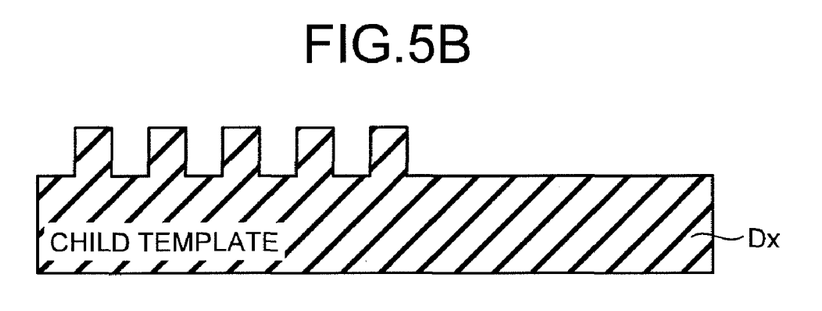

FIG. 5A and FIG. 5B are diagrams illustrating the manufacturing process procedure of the child template. FIG. 5A and FIG. 5B illustrate cross-sectional views of the parent template Tx, a template substrate 1C, the child template Dx, and the like. The manufacturing process of the child template Dx includes the NIL (nanoimprint lithography) process.

The child template Dx is manufactured by using an imprint apparatus 23 and the parent template Tx. For manufacturing the child template Dx, the template substrate 1C that is a blank substrate (quartz substrate) is used.

In the manufacturing process of the child template Dx, a processing target film 2C (HM used in processing the child template Dx) to be a hard mask is formed above the template substrate 1C and a resist 6A (wafer NIL resist) is applied to the processing target film 2C as photocurable or thermosetting resin.

The resist 6A is patterned by being irradiated with light in a state where the parent template Tx is pressed against the resist 6A (FIG. 5A). Specifically, the parent template Tx is moved closer to the upper portion of the template substrate 1C and is pressed thereto. Consequently, the resist 6A is filled in concave portions of the parent template Tx. When the resist 6A is photocurable resin, the parent template Tx is irradiated with light after the resist 6A is completely filled in the concave portions. Consequently, the resist 6A is cured. Thereafter, the parent template Tx is separated from the template substrate 1C (releasing). After removing the resist residual film (thin film remaining in the lower portion of the resist pattern) after the releasing, the processing target film 2C is etched with the patterned resist 6A as a mask, whereby the processing target film 2C is patterned.

Thereafter, a resist residue on the processing target film 2C is asked, and then the template substrate 1C is cleaned. Then, the template substrate 1C is etched with the patterned processing target film 2C as a mask. Consequently, the child template Dx on which the pattern of the parent template Tx is transferred is manufactured (FIG. 5B). The template patterns of the child templates D1 to Dn are patterns obtained by reversing and copying the patterns of the parent templates T1 to Tn, respectively.

(Forming Process Procedure of On-Wafer Pattern)

Next, the forming process procedure of the on-wafer pattern is explained. After manufacturing the child template Dx, the on-wafer pattern (on-wafer pattern 5B to be described later) is formed on the processing target film above the product wafer W2 by performing the NIL using this child template Dx. When forming the on-wafer pattern 5B, the parent template Tx (the child template Dx) is selected which corresponds to misalignment of a pattern that is formed on the lower layer side of the on-wafer pattern 5B to be formed and a pattern (the lower-layer-side pattern 7) used for alignment (overlaying) of the on-wafer pattern 5B to be formed.

For example, when each shot of the lower-layer-side pattern 7 has misalignment of the rotation component, the parent template Tx corresponding to a shot whose misalignment is corrected by the correction 42 explained in FIG. 3 is selected. Then, the on-wafer pattern 5B is formed by using the child template Dx manufactured by using this parent template Tx. Consequently, a pattern alignment can be accurately performed between the lower-layer-side pattern 7 and the on-wafer pattern 5B to be formed on the upper layer side of the lower-layer-side pattern 7 (between layers).

When selecting the parent template Tx, a degree of alignment with respect to the lower-layer-side pattern 7 (base) is measured for each parent template Tx. This measurement (alignment measurement with respect to the lower-layer-side pattern 7) is performed, for example, after forming a resist pattern corresponding to the template pattern of the parent template Tx on the template wafer W1. The measurement can be performed after etching the processing target film with a resist pattern corresponding to the template pattern or can be performed after cutting off the parent template Tx from the template wafer W1. Moreover, the measurement can be performed by using the child template Dx after manufacturing the child template Dx by using the parent template Tx.

It becomes possible to measure an accurate alignment amount by performing the measurement by using the child template Dx. Moreover, the alignment amount can be measured easily without requiring time and effort until the measurement by performing the measurement at an early stage (upstream process) in the pattern forming process.

Moreover, the measurement can be performed on all of the parent templates Tx or can be performed on part of the parent templates Tx. When the measurement is performed on part of the parent templates Tx, the parent template Tx whose misalignment amount likely falls into a desired range is selected and the measurement is performed thereon.

In the similar manner, the measurement can be performed on all shots on the template wafer W1 or can be performed on part of shots. When the measurement is performed on part of shots, the shot (the parent template Tx) whose misalignment amount likely falls into a desired range is selected and the measurement is performed thereon.

Moreover, the measurement can be performed on all of the child templates Dx or can be performed on part of the child templates Dx. When the measurement is performed on part of the child templates Dx, the child template Dx whose misalignment amount likely falls into a desired range is selected and the measurement is performed thereon.

When the measurement is performed on a pattern on the template wafer W1 or the parent template Tx, it is applicable to manufacture only the child template Dx corresponding to a shot on the template wafer W1 or the parent template Tx selected based on the measured result.

Moreover, the measuring method of the measurement includes (1) method of measuring an absolute value of a pattern position of the child template Dx, the parent template Tx, or the template wafer W1, (2) method of preparing the on-wafer pattern or the template pattern of a quartz template to be a reference and measuring a relative position of the child template Dx, the parent template Tx, or the template wafer W1 with respect to this pattern, and the like.

The child template Dx or the parent template Tx, whose misalignment amount with respect to the lower-layer-side pattern 7 is equal to or lower than a predetermined reference value, is selected based on the measured result obtained by using these measuring methods (1) and (2). Consequently, the alignment accuracy in the NIL can be improved.

Figure 6A:
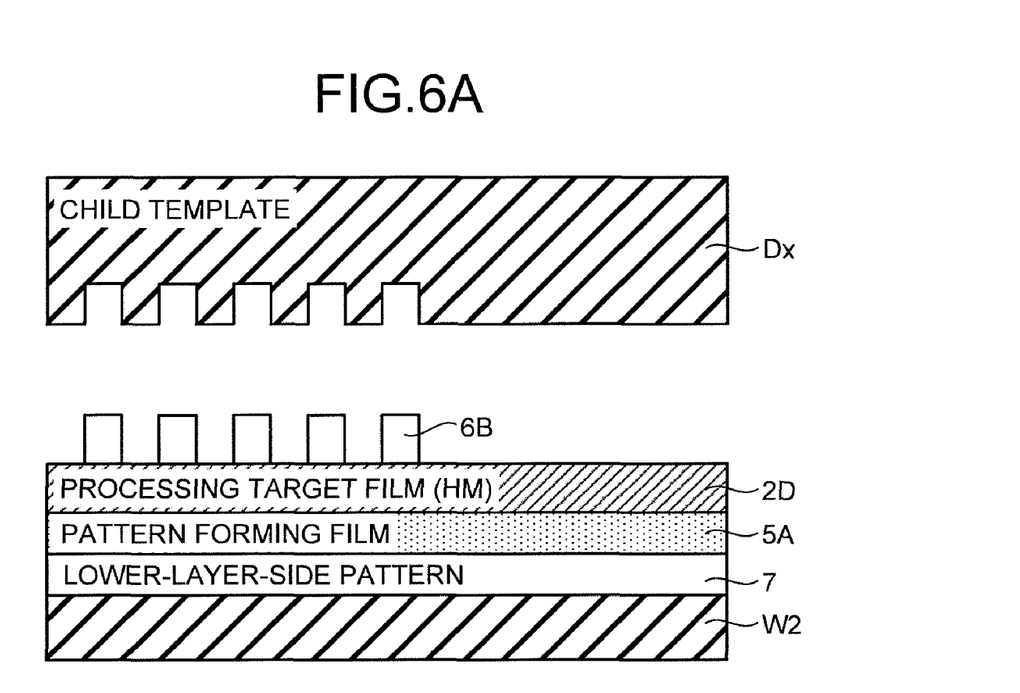
FIG. 6A and FIG. 6B are diagrams illustrating a forming process procedure of an on-wafer pattern.
Figure 6B:
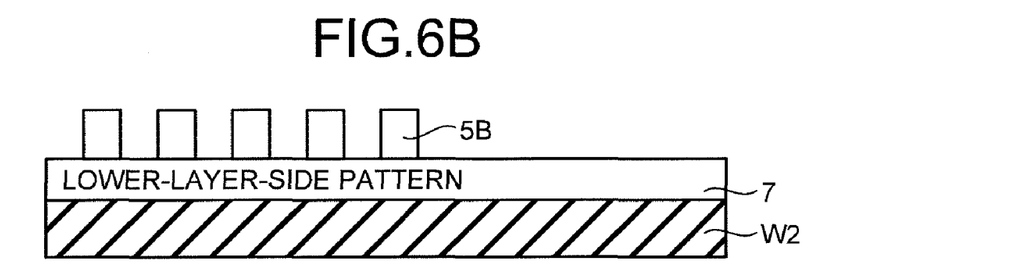

FIG. 6A and FIG. 6B are diagrams illustrating the forming process procedure of the on-wafer pattern. FIG. 6A and FIG. 6B illustrate cross-sectional views of the child template Dx, the product wafer W2, and the like. The manufacturing process of the on-wafer pattern 5B includes the NIL process. The on-wafer pattern 5B is formed above the product wafer W2 by using the imprint apparatus 23 and the child template Dx. The product wafer W2 is a process substrate (such as a silicon substrate) for transferring a pattern formed on the child template Dx by the NIL process.

A pattern (the lower-layer-side pattern 7) on the lower layer side that is aligned with the on-wafer pattern 5B is formed in advance above the product wafer W2. Moreover, a pattern forming film (processing target film) 5A used for forming the on-wafer pattern 5B is formed in advance above the lower-layer-side pattern 7. Furthermore, a processing target film (HM used in processing the pattern forming film 5A) 2D to be a hard mask is formed above the pattern forming film 5A and a photocurable or thermosetting resist (wafer NIL resist) 6B is applied to the processing target film 2D.

The resist 6B is patterned by being irradiated with light in a state where the child template Dx is pressed against the resist 6B (FIG. 6A). Thereafter, the child template Dx is separated from the product wafer W2 (releasing). After the resist residual film is removed after the releasing, the processing target film 2D is etched with the patterned resist 6B as a mask, whereby the processing target film 2D is patterned.

Thereafter, a resist residue on the processing target film 2D is ashed, and then the product wafer W2 is cleaned. Then, the pattern forming film 5A is etched with the patterned processing target film 2D as a mask. Consequently, the pattern of the child template Dx is transferred onto the pattern forming film 5A and the on-wafer pattern 5B is formed above the product wafer W2 (FIG. 6B).

In the present embodiment, the case is explained in which the lower-layer-side pattern 7 is formed by using the exposure apparatus (photolithography); however, the lower-layer-side pattern 7 can be a pattern formed by using the NIL. Moreover, the pattern formation using the child template Dx can be performed on any layer. For example, the pattern forming process using the child template Dx is performed on all or part of the layers above the product wafer W2. When the pattern forming process using the child template Dx is performed on all of the layers above the product wafer W2, the manufacturing process of the master mask, the manufacturing process of the parent template Tx, the manufacturing process of the child template Dx, and the pattern forming process on the product wafer W2 using the child template Dx described above are repeated for each layer. Consequently, a semiconductor device (semiconductor integrated circuit) is manufactured on the product wafer W2.

Moreover, the master mask M1, the template wafer W1, the parent template Tx, and the child template Dx can be manufactured at any timing. For example, the master mask M1, the template wafer W1, the parent template Tx, and the child template Dx can be manufactured before forming the lower-layer-side pattern 7 or after forming the lower-layer-side pattern 7.

Figure 7:
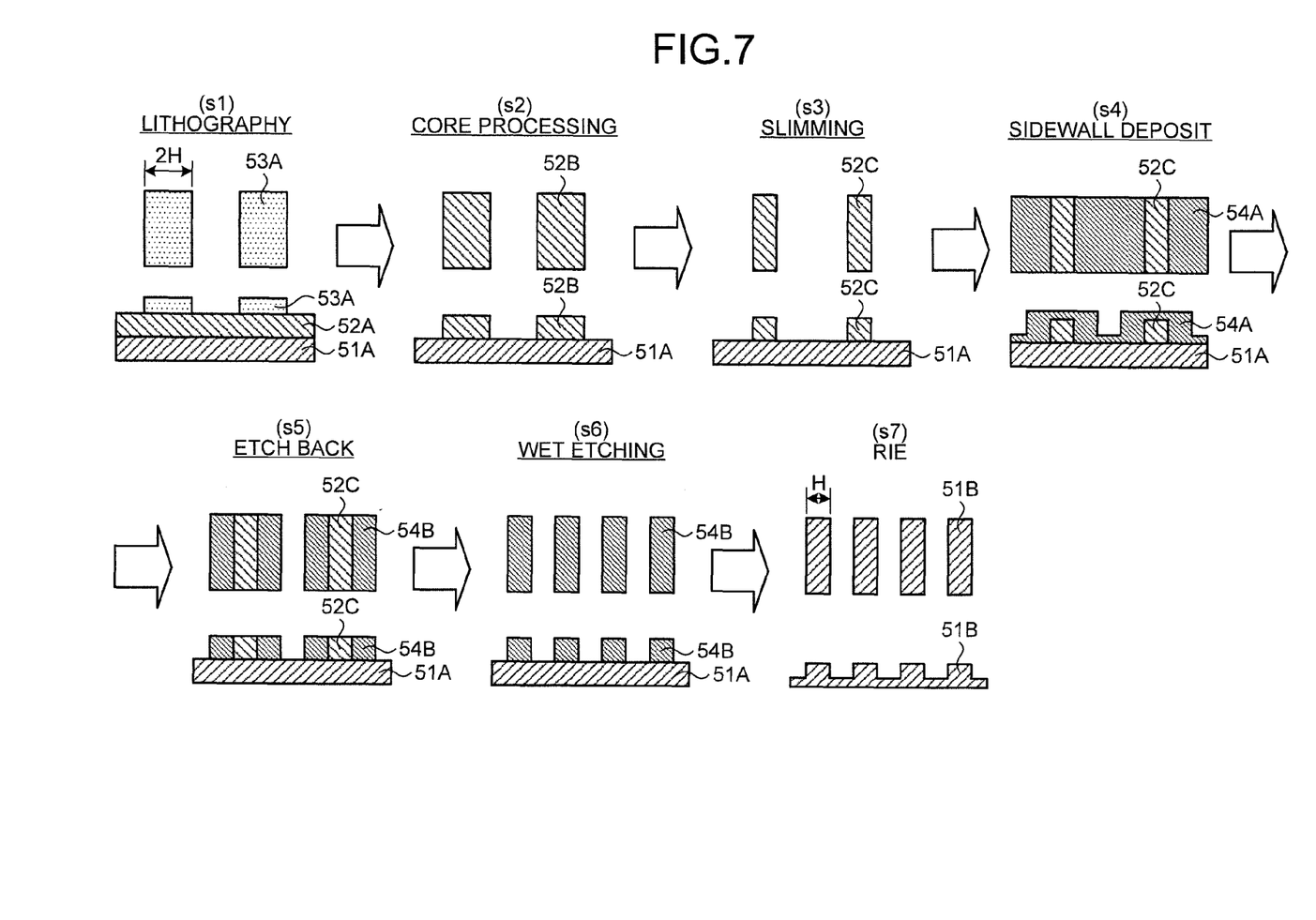
FIG. 7 is a diagram illustrating a process flow of a sidewall process.

Furthermore, a sidewall process can be used when manufacturing the parent template Tx. FIG. 7 is a diagram illustrating a process flow of the sidewall process. The sidewall process (sidewall-line transferring process) is a process of forming a line pattern same as a sidewall pattern by transferring the sidewall pattern onto the lower layer side. The upper stage side of each of processes (s1) to (s7) shown in FIG. 7 is a top view (only the uppermost layer) in the pattern formation and the lower stage side is a cross-sectional view in the pattern formation.

In the sidewall-line transferring process, a pattern forming layer 51A to be a target of the pattern formation and a core layer 52A for forming a core on the upper layer of this pattern forming layer 51A are formed in advance on the upper layer of the substrate. Then, a resist pattern 53A with a minimum processing width 2H is formed on the upper layer of the core layer 52A by performing the exposure process in various exposure conditions for the shots (s1).

Thereafter, the core layer 52A is etched with the resist pattern 53A as a mask by the RIE (Reactive Ion Etching) method or the like to form a core pattern 52B (s2). Then, a slimming pattern 52C is formed by performing slimming processing on this core pattern 52B (s3). It is applicable to form the slimming pattern 52C by performing the slimming processing on a film pattern formed by transferring a resist pattern onto a base (not shown).

Next, a sidewall deposit film 54A such as a nitride film is deposited above the substrate by the CVD (Chemical Vapor Deposition) method or the like (s4). Thereafter, the sidewall deposit film 54A is etched back by an anisotropic etching such as the RIE and a sidewall pattern 54B is formed from the sidewall deposit film 54A (s5).

Then, the slimming pattern 52C is removed by performing an wet etching on the slimming pattern 52C to leave only the sidewall pattern 54B above the pattern forming layer 51A (s6). Thereafter, the pattern forming layer 51A is etched by the RIE or the like with the sidewall pattern 54B as a mask to form a line pattern 51B (s7). Consequently, the line pattern 51B with a line width H can be formed. This line pattern 51B becomes the template pattern of the parent template Tx.

The sidewall process is not limited to the above described sidewall-line transferring process and can be a sidewall-space transferring process. The sidewall-space transferring process is a process of forming a space pattern same as the sidewall pattern by transferring the sidewall pattern onto the lower layer side.

As above, according to the embodiment, the parent templates Tx having various misalignments are manufactured by using a misalignment correction function of the exposure apparatus 22, so that the child template Dx corresponding to the misalignment of the lower-layer-side pattern 7 can be selected. Therefore, when performing the pattern formation on the upper layer side of the lower-layer-side pattern 7 by the NIL, a pattern on the upper layer side can be formed while accurately performing alignment between the upper layer side and the lower layer side. In other words, it is possible to accurately perform alignment between layers when performing the pattern formation by using the NIL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a pattern comprising:
    forming a first on-substrate pattern by applying a predetermined misalignment distribution for each shot above a first substrate by an exposure apparatus and thereafter manufacturing first templates by cutting off the first on-substrate pattern out of the first substrate for each shot;
    manufacturing second templates by transferring template patterns of the first templates onto a template substrate by an imprint technology; and
    forming a second on-substrate pattern as an upper-layer-side pattern above a second substrate by transferring a template pattern of a second template onto the second substrate by an imprint technology by using the second template in which an inter-layer misalignment amount that is a misalignment amount between a lower-layer-side pattern already formed above the second substrate and the upper-layer-side pattern to be formed above the second substrate becomes equal to or lower than a predetermined reference value.

2. The method according to claim 1, further comprising:
    estimating the inter-layer misalignment amount after the manufacturing the second templates; and
    selecting a second template used for the forming the second on-substrate pattern from among the second templates based on an estimated result.

3. The method according to claim 1, further comprising:
    estimating the inter-layer misalignment amount after the manufacturing the first templates; and
    selecting a first template used for the manufacturing the second templates from among the first templates based on an estimated result.

4. The method according to claim 1, wherein the applying the misalignment distribution for each shot includes changing a parameter that changes a misalignment distribution of the first on-substrate pattern by the exposure apparatus.

5. The method according to claim 1, wherein the misalignment distribution is set for each combination of an exposure apparatus and a photomask used when forming the lower-layer-side pattern.

6. The method according to claim 1, wherein the misalignment distribution of each shot includes a misalignment component in a rotation direction or a distortion component of misalignment.

7. The method according to claim 3, wherein the inter-layer misalignment amount is estimated by, after a resist pattern corresponding to the first on-substrate pattern is formed above the first substrate, measuring a position of the resist pattern.

8. The method according to claim 3, wherein the inter-layer misalignment amount is estimated by measuring a position of the first on-substrate pattern.

9. The method according to claim 1, wherein the lower-layer-side pattern is a pattern formed by using a photolithography technology or an imprint technology.

10. The method according to claim 1, wherein the manufacturing the first templates is performed by using a sidewall process.

* * * * *